Sept. 3, 1968 J. A. ROSS ET AL 3,400,334

SOLID STATE SWITCHING TYPE LINEAR AMPLIFIER

Filed Nov. 12, 1964 2 Sheets-Sheet 1

INVENTORS
JAMES A. ROSS
TADEUSZ W. MACIEJOWSKI
THOMAS R. PARKHILL

Harry R. Lubcke
AGENT

SOLID STATE SWITCHING TYPE LINEAR AMPLIFIER

Filed Nov. 12, 1964 2 Sheets-Sheet 2

INVENTOR.
JAMES A. ROSS
TADEUSZ W. MACIEJOWSKI
THOMAS R. PARKHILL
Harry R. Lubcke
AGENT 3,400,334

SOLID STATE SWITCHING TYPE LINEAR AMPLIFIER

James A. Ross, Villa Park, Tadeusz W. Maciejowski, Orange, and Thomas R. Parkhill, Whittier, Calif., assignors to Ling-Temco-Vought, Inc., Dallas, Tex., a corporation of Delaware Filed Nov. 12, 1964, Ser. No. 410,686
8 Claims. (Cl. 330—10)

ABSTRACT OF THE DISCLOSURE

This invention relates to a switching-type linear amplifier wherein the input signal to be amplified is mixed with a relatively high-frequency signal. A comparator circuit establishes a rectangular waveform having excursions depending upon the duration of the mixed signal above a threshold. The rectangular waveform is then differentiated and the resulting signals of corresponding polarity are employed to drive respective sides of a push-push power amplifier which functions as a switch to pass or block current from a power source through a low pass filter to develop an output signal across a load which is an amplified replica of the input signal.

This invention relates to an electrical amplifier and particularly to such a device which employs timed switching functioning at constant amplitude to amplify a signal having variable amplitude and frequency.

The conventional amplifier, employing either vacuum tubes or solid state equivalents such as transistors, in which varying amplitudes are amplified as varying amplitudes, is well known.

The transformation of the amplitude of a signal to a corresponding duration of repetitive pulses having a frequency of repetition greater than the highest frequency of the signal is also known, and is termed pulse width modulation.

The use of pulse width modulation as an intermediary in high power amplification is attractive in that the high power active elements either act at full power capabilities or are switched off. In fact, in embodiments according to this invention, dissipation in such active elements is appreciable only *during* the switching transition. By arranging the switching time to be rapid power efficiencies approaching 100% can be achieved.

However, an attempt to apply the known techniques of the previously mentioned fields result in apparatus that tends to be self-destroying. Other factors tend to prevent full modulation in the process of pulse width modulation. Certain configurations of apparatus prevent amplification to and including direct current signal variations.

In order to produce a reliable solid state switching type linear amplifier having an output power capability of several kilowatts it was necessary to learn the reasons for the shortcomings of the methcds and apparatus evolved from the known art and to evolve further method steps and configurations of apparatus to overcome such deficiencies.

In order to prevent self-destruction the inclusion of protective elements in the high power stages was required. It is necessary that such elements function in a few microseconds to remove the excitation to such stages regardless of where a fault might develop. This has been accomplished by employing controlled solid state devices, such as silicon controlled rectifiers, which are fired by an abnormally large current in any of the semiconductor devices employed in the high power stages. A fault occurring on one side of the push-push power amplifier stage has been made effective in removing energization to both driver stages and thus to both sides of the push-push power amplifier, by employing cross-connected pulse transformers. This is necessary to provide the required protection, as will be later explained.

In order to provide a full degree of modulation it was necessary to employ a push-push power amplifier with two (solid state) switching means, or two groups of such means connected in parallel in each group to increase the power-handling capability over that obtainable with only a pair of such means.

In order to accomplish amplification to and including direct current, a capacitor normally required in series with the load was eliminated by employing *two* primary current sources to energize the push-push connected power output stage. These sources are typically connected in a series aiding relation and may be batteries or equivalent power supplies.

In order to enhance fidelity at low frequencies approaching direct current it was necessary to employ differentiating means to pass the pulse-width information through transformers. The transformers are required to permit a necessary configuration of direct (current) potentials to allow the push-push stage to operate. With the differentiation method step transformers having only a relatively high pass characteristic are required. The timing information is accurately passed. This information is then reconverted to a second pulse-width modulated rectangular waveshape for side of the push-push power amplifier. When it is attempted to preserve the original rectangular waveshape the transformers must have a relatively wide pass band characteristic, which is less satisfactorily achieved in practice.

Additionally, for accomplishing rapid transitions in switching the semiconductor devices of the power amplifier, a preceding stage is provided with reverse bias on the base-to-emitter junctions of the semiconductor devices thereof. It is necessary that the means for supplying the reverse bias have low impedance with respect to the impedance of the circuit involved.

An object of this invention is to provide linear amplification of a signal which has variations in amplitude and/or frequency, by means of the timed switching of solid state elements operating at constant amplitude.

Another object is to prevent self-destruction of a solid state amplifier by integrating solid state protective elements thereinto.

Another object is to provide a wide modulation capability, and thus correspondingly large voltage amplification, for a switching type linear amplifier.

Another object is to provide a method and apparatus for accomplishing amplification to and including direct current.

Another object is to provide apparatus suited to rapidly execute transitions from maximum to minimum switching states and vice versa.

Another object is to provide means for efficiently amplifying electrical signals.

Other objects will become apparent upon reading the following detailed specification and upon examining the accompanying drawings, in which are set forth by way of illustration and example certain embodiments of this invention.

Figure 1:
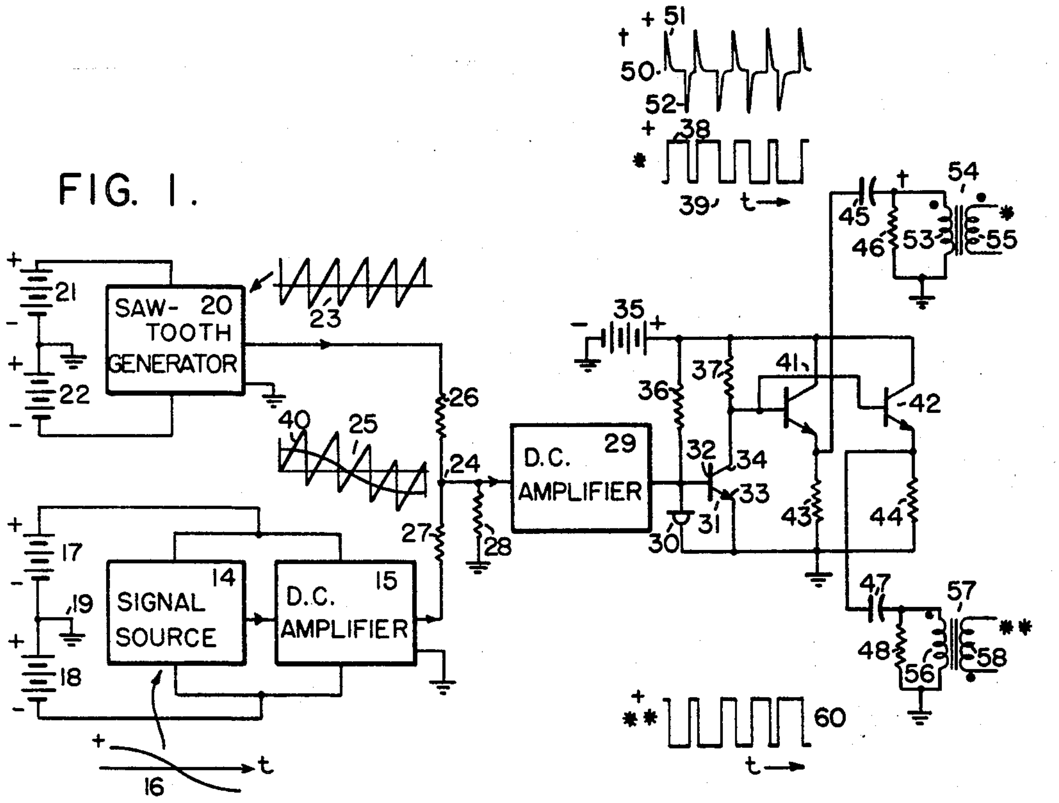
FIGURE 1 is a partly block and partly schematic diagram of the input and preliminary stages of the amplifier, including waveforms illustrative of the functioning thereof.
Figure 2:
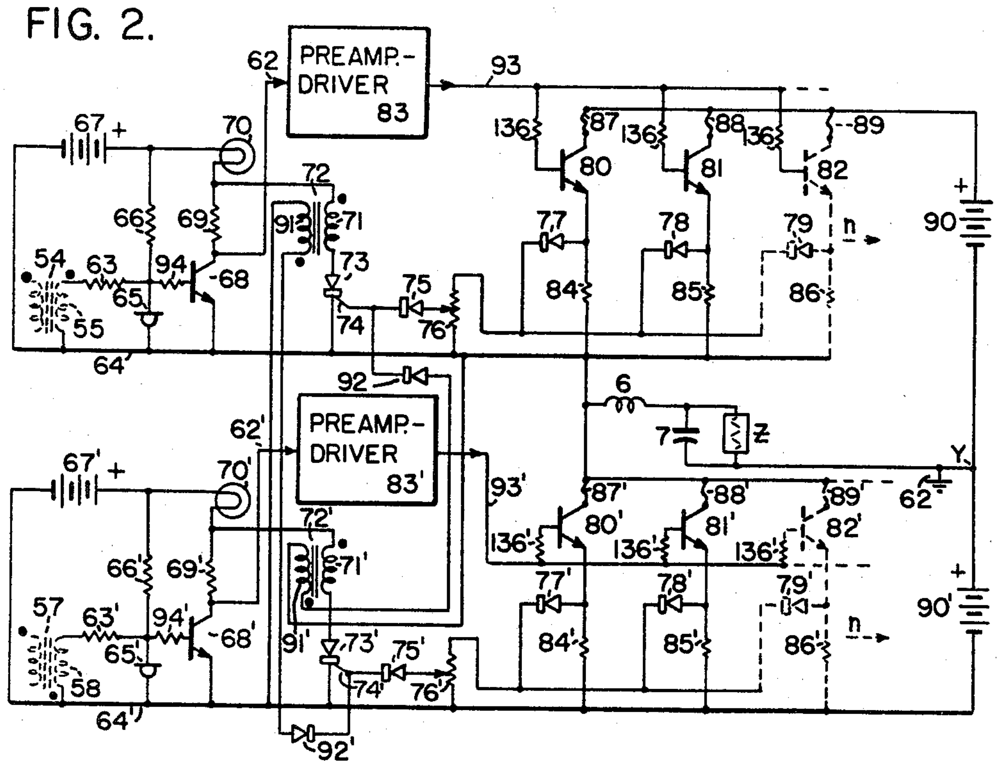
FIGURE 2 is a schematic diagram of the intermediate and final power amplifier stages of the amplifier, including the protective elements.
Figure 3:
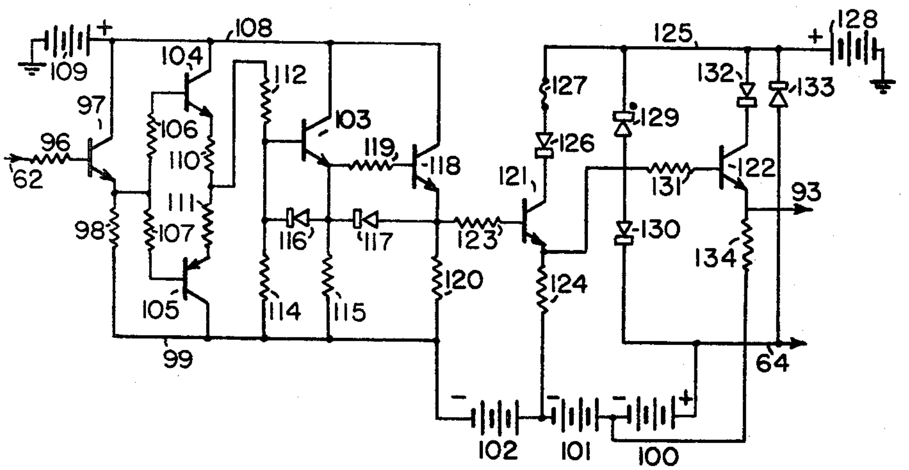
FIGURE 3 is a schematic diagram of the preamplifier and driver stages of the amplifier of FIG. 2.

In that form of the present invention chosen for illustration in the drawings, FIGS. 1, 2, and 3 show the apparatus employed to accept the signal to be amplified, convert it to a pulse width modulated signal, and provide two oppositely phased outputs for driving the power amplifier portion of the apparatus. Block 14 denotes a signal source and block 15 a direct current amplifier connected to the signal source to amplify the variations of the signal and to isolate the remainder of the input apparatus from the signal source. The signal source 14 need not be an integral part of the solid state amplifier according to this invention, but may be an audio and/or subaudio frequency oscillator, a "white noise" generator, a magnetic tape reproducer for providing electrical signals corresponding to selected sounds, vibrations, etc., a microphone, or a combination of these instrumentalities. Amplifier 15 is normally selected to amplify audio frequencies as well as a level of direct current, so that the system is suited to amplify all signals from direct current through audio frequencies.

A half wave of a typical alternating voltage (or current) constituting the signal waveform is shown at 16. In this and other waveforms shown in FIG. 1, time is the abscissa, it progresses to the right and positive voltage is the ordinate above the time axis. Normally the signal waveform is essentially continuous, only a very short sample has been selected here for illustrative purposes. It will be understood that in the case of noise, speech, etc. the waveform is typically irregular with respect to the half wavelength of sine wave shown.

Batteries 17 and 18 supply power to amplifier 15 and also to signal source 14 if this is a part of the system. Each battery may have a voltage of the order of 15 volts and the two are connected in series-aiding polarity, with ground connection 19 attached to the junction between the two batteries. Equivalent power supplies may be used in place of the batteries.

The direct current amplifier is of the known type and may have a gain of 10 times (20 db). The grounded center connection is used for the battery sources so that both positive and negative signals with respect to ground can be linearly amplified.

A chopper oscillator constituted to produce an electrical variation varying repetitively linearly as a function of time is represented in FIG. 1 by sawtooth generator 20. This may be a known resistance-capacitance relaxation oscillator employing transistors. It is powered by batteries 21, 22 in the same way as batteries 17 and 18 powered the devices previously discussed. In practice, one pair of batteries or equivalent power supplies can be used for both of these purposes.

The output of the sawtooth generator is illustrated by waveform 23. The peak to peak voltage thereof may be approximately 10 volts. This is arranged to be equal to or slightly greater than the maximum amplitude of the input signal from source 14 as amplified by amplifier 15. It is to be noted that the frequency of the sawtooth waveform is greater than that of the illustrative half cycle of signal. From two to three times greater is preferable with the simple inductance-capacitance filter 6, 7.

Numeral 24 identifies a resistive matrix mixing point at which waveforms 16 and 23 are mixed. This results in superposition of the two waveforms, forming waveform 25. For this purpose, resistors 26 and 27, connected respectively, from generator 20 to mixing point 24 and from amplifier 15 to mixing point 24, may have a resistance value of the order of 10,000 ohms. Should vacuum tubes be employed in the output stages of entities 15 and 20, these resistors would have resistances at least ten times the value given. These resistors serve to isolate entities 15 and 20, one from the other. Resistor 28 is the mixing resistor and it connected between point 24 and ground. The resistance value thereof is approximately one-tenth that of either resistor 26 or 27.

Direct current amplifier 29 is similar to D.C. amplifier 15. It is connected to point 24 to raise the level of waveform 25 from approximately one volt to 10 volts.

Amplifier 29 feeds a zero hysteresis threshold circuit which is comprised of tunnel diode 30 and transistor 31. Tunnel diode 30 is biased to be monostable, as at 0.070 volts for a General Electric germanium tunnel diode. This arrangement forms the same type of device as the known Schmidt trigger, but devoid of hysteresis of the threshold level. The tunnel diode is in the high voltage low current state when the input voltage exceeds the triggering level and is in the low voltage high current state when the input voltage is below the triggering level. The required bias is provided by battery or equivalent power supply 35. This has a voltage of 15 volts. Either source 17 or 21, previously identified, may be used to take the place of source 35. In any event, the positive terminal of the source is connected to the anode of tunnel diode 30 through resistor 36, which resistor may have a resistance of 100 ohms. The cathode of the tunnel diode is connected to ground.

Transistor 31 acts as an amplifier to convert the low voltage rectangular waveform generated by tunnel diode 30 to a higher voltage rectangular waveform. This is typically from 0.4 volt peak to peak to 15 volts peak to peak. Base 32 of the transistor is connected to the anode of the tunnel diode 30 and also to the output of amplifier 29 because of this connection. The transistor is of the NPN type. Emitter 33 is connected to ground and collector 34 is connected through resistor 37 to the positive terminal of battery 35. Resistor 37 has a resistance of 10,000 ohms. When an amplified equivalent of waveform 25 is impressed upon elements 30 and 32 those excursions thereof that are below the axis pass through the diode and cause the transistor to switch OFF. This produces a positive pulse, as pulse 38 of waveform 39, from the first cycle 40 of waveform 25. When the level is above the threshold of tunnel diode 30, as at the bottom of the sawtooth waveform below the axis just following cycle 40, then transistor 31 is switched ON and the deep downward excursion following pulse 38 in waveform 39 is formed. It will be noted that the *duration* of the pulses in waveform 39 correspond to the duration of positive excursions in waveform 25, which condition, of course, is sought.

The output from collector 34 of transistor 31 passes to the bases of two emitter-follower transistors 41 and 42. These are low impedance driving sources for accomplishing differentiation. Resistor 43 is connected between the emitter of transistor 41 and ground and resistor 44 is connected between the emitter of transistor 42 and ground. Each have a resistance of 500 ohms. However, the impedance of the emitter-follower stage is less than this in each case, such as 50 ohms.

Differentiating capacitor 45 is connected to the emitter of transistor 41 and may have a capacitance of the order of 0.007 microfarad. The second terminal of this capacitor is connected to resistor 46, the second terminal of which is connected to ground. The resistance thereof is of the order of 200 ohms. Capacitor 47 is connected to the emitter of transistor 42 and is connected to resistor 48 in the same way as has been set forth for resistor 46. The values for the second differentiating circuit are the same as for the first differentiating circuit.

The waveform that is impressed upon each differentiating circuit is the same and is illustrated by waveform 39. Each differentiating circuit produces the spiked equivalent thereof, as waveform 50, which has upward projecting spikes, as 51, for each upward excursion of waveform 39 and downward projecting spikes, as 52, for each downward excursion of waveform 39.

Primary 53 of pulse transformer 54 is shunted across resistor 46. Because of the differentiating process just described, the pulse transformer need amplify only relatively high frequency pulses, as 51 and 52, rather than the whole rectangular waveform 39. This allows a smaller transformer and avoids difficulties from tilting the horizontal portions of the rectangular waveform. Also, a typical waveform for this apparatus, as 39, if applied to an ordinary transformer rather than to a pulse transformer has a net D.C. level above or below the zero axis. This causes D.C. current to flow in the primary, which causes saturation of the core and loss of coupling.

Furthermore, should an inferior transformer be used, that is, one with large leakage inductance, the steeply rising rectangular waveshape (as 39) is integrated and seriously distorted.

As a practical matter, because of iron losses, copper losses, etc., etc., a wide band transformer would be required to faithfully pass a ten kilocycle pulse-width modulated waveform. The required bandwidth would be from D.C. to approximately one megacycle. It is thus seen that the differentiating step which we employ to avoid all of these difficulties is an important one.

Secondary 55 of transformer 54 has the same polarity as primary 53, as to the directions of the windings, so that the polarity of waveform 39 is unchanged when it is reformed by apparatus to be described in connection with FIG. 2.

In the lower right part of FIG. 1, primary 56 of pulse transformer 57 is shunted across differentiating resistor 48.

Thus, when an upward-going excursion 51 of differen- with respect to primary 56. This is indicated by the presence of the dots at each end of the winding being at opposite ends with respect to the showing of the core, whereas with transformer 54 the dots are shown at the same ends. With transformer 57 a *reversal* of phase is thus obtained; i.e., the phase of waveform 60 when waveform 50 has been reformed by the apparatus at the initial part of FIG. 2.

An important purpose of transformers 54 and 57 is to isolate the driving waveforms 39 and 60 from ground so that the necessary push-push functioning of the power stage of FIG. 2 can be achieved. The transformation ratio of each transformer is typically 1 to 1.

In FIG. 2 it will be noted that there is only one ground connection, 62, and that this is at the battery junction point Y. It will also be noted that transformers 54 and 57 are shown dotted in FIG. 2. This is to establish the points of connection between the portions of the circuits of FIGS. 1 and 2.

Continuing with FIG. 2, resistor 63 is connected to one end of secondary 55, while the other end thereof is connected to the common (but *not* grounded) bus 64. Tunnel diode 65 is connected between the second terminal of resistor 63 and bus 64, with the anode of the diode connected to the resistor. Resistor 66 connects from the said anode to the positive terminal of battery or equivalent power supply 67, the negative terminal of which connects to bus 64. Resistors 63 and 66 may each have a resistance of the order of 1,000 ohms.

Tunnel diode 65 is biased to a smaller voltage than that of previous tunnel diode 30, so that diode 65 has a load line that intersects the characteristic in the negative resistance region thereof and in each of the two positive resistance regions as well. This provides a bistable circuit, of the nature of a flip-flop.

Thus, when an upward-going excursion 51 of differentiated waveform 50 is impressed upon tunnel diode 65, the maximum value thereof is retained at the anode of diode 65 as the potential until the next downward-going excursion 52 occurs, at which time the potential at the anode reduces to a minimum value. This functioning reproduces rectangular waveform 39 from the differentiated pulses of waveform 50 and thus accomplishes the process previously mentioned.

The base of transistor 68 is connected to the anode of tunnel diode 65 through resistor 94, to be later identified. The emitter of the transistor connects to bus 64 and the collector to a resistor 69. The transistor is of the NPN type. Resistor 69 has a resistance of the order of 10,000 ohms, and it also connects to incandescent lamp 70. The second terminal of the lamp connects to the positive terminal of battery 67. Primary 71 of transformer 72 connects to the junction between resistor 69 and lamp 70.

The anode of a controlled semiconductor device, such as silicon controlled rectifier 73, is connected to the second terminal of primary 71 and the cathode thereof is connected to bus 64. The control electrode thereof, 74, is connected to the cathode of ordinary diode 75, the anode of which is connected to the adjustable contact of potentiometer 76. The latter is connected to the cathodes of several diodes 77, 78, 79, etc., which are connected to the emitters of a corresponding number of power solid state devices, such as power transistors 80, 81, 82, etc.

In FIG. 2 the number of these devices is indicated as optional and likely multiple by the dotted rendition of transistor 82 and the circuit associated therewith, also by the letter *n* and the dotted arrow adjacent thereto. The number of the transistors employed depends upon the power-handling capability of each and the total power output of the amplifier desired. The number may be one, but for an amplifier having an output in excess of two kilowatts, 36 transistors are used, 18 on each side of the push-push power amplifier stage. These are typically grouped eight in a series, such as 80, 81, 82, etc., and are driven by a preamplifier "preamp"-driver combination 83, which is further described in connection with FIG. 3. Each power transistor may have an 80 watt rating and be of the NPN type.

The base electrodes of each power transistor are driven by a connection 93 to the driver portion of preamp-driver 83, through resistors 136 to be later described. Each emitter of each power transistor is connected through a resistor, as 84, 85, 86, etc., having a small value of resistance such as 0.1 ohm, to common bus 64. Each collector is connected to an ordinary fuse, as 87, 88, 89, etc., and therethrough to the positive terminal of battery 90, or equivalent, the negative terminal of which is connected to ground at Y.

The fuses may have a rating of 10 amperes each and are only for protection of the amplifier after the very rapid protection elements have acted, as will be later described.

It will be noted that the top and bottom halves of the circuit of FIG. 2, are symmetrical, save for the reversed polarity of secondary 58, as has been explained. Accordingly, primed reference numerals, as 63′ for the first resistor, have been employed and the bottom half has not been further described.

There is a small amount of cross connection circuitry; i.e., secondary 91 of transformer 72 connects to lower bus 64′ and through the anode of ordinary diode 92′ to the cathode thereof and then to control electrode 74′ of silicon controlled rectifier 73′. In an exactly similar manner, secondary 91′ of transformer 72′ connects to upper bus 64 and through the anode of ordinary diode 92 to the cathode thereof and then to control electrode 74 of silicon controlled rectifier 73.

The protective aspect of the power amplifier of FIG. 2 operates as follows. It will be understood that it is undesirable to overload the power transistors, 80, 81, 82, etc., since should that occur, one or more of the given series becomes defective and passes excessive current. In order to prevent overloading, the adjustable contact of potentiometer 76 is set by considering the results of a prior test to a resistance value such that a pulse or voltage level appearing at the upper end of any resistors 84, 85, 86, etc. is not sufficient to trigger silicon controlled rectifier 73 during normal operation of the amplifier. However, when abnormal operation occurs at one or more of the power transistor circuits the current through the corresponding resistor 84, 85, 86, etc. is considerably larger and is fully adequate to trigger silicon controlled rectifier 73 through its control electrode 74, as fed through isolation diode 75.

As soon as this happens, rectifier 73 presents substantially a short circuit from its anode to cathode. This causes a relatively large current to flow from battery 67, through lamp 70, through primary 71 of transformer 72 to common bus 64 and thence back to the negative terminal of battery 67. This current is sufficient to illuminate lamp 70 to substantially full brilliancy. The normal current taken by transistor 68 is not sufficient to illuminate lamp 70 at all. This lamp may be a 28 volt 80 milliampere incandescent lamp; thus, the relatively large current is of the order of 80 milliamperes.

What the firing of the rectifier and the illuminating of the lamp does is to clamp the potential at the junction between lamp 70 and resistor 69 at a low value, such that transistor 68 is rendered inoperative due to insufficient collector supply voltage. This prevents any input signal from reaching preamp-driver 83 and thus removes the signal excitation from the bases of power transistors 80, 81, 82, etc. This causes the transistors to remain OFF and in this way prevents damage to them by overload.

At the same time as a pulse of current passes through transformer primary 71 a corresponding pulse is induced in secondary 91 of transformer 72. This is conveyed by connections from that secondary to ordinary diode 92' and therethrough to the control electrode 74' of silicon controlled rectifier 73'. The second terminal of secondary 91 is connected to bus 64'. The pulse from this secondary is sufficient to fire silicon controlled rectifier 73'. Lamp 70' is thus illuminated and a signal output from transistor 68' is inhibited. The excitation is thereby removed from both sides of the push-push amplifier although an overload may have occurred on only one side thereof. This is necessary to prevent destruction of all of the transistors on the side of the amplifier where the fault did *not* occur. On that side, when the signal drive next turns these transistors ON, they are forward conducting with the combined voltage of both batteries 90 and 90', typically 160 volts total, impressed upon them and only 0.1 ohm circuit impedance in each. When the signal drive is shut off, these transistors are open circuits.

Should only one output transistor, as any one of 80, 81, 82, 80', 81' or 82', break down and become a short circuit, most of the output current from either battery 90 or 90' will flow through it. The positive voltage drop built up across its 0.1 ohm resistor, as 84, 85, 86, 84', 85' or 86', will be much greater than across any of the other of these resistors. This will cause the one diode connected thereto of the group 77, 78, 79, 77', 78' or 79' to conduct but *not* any others of the group to conduct. Thus, the full voltage developed across the resistor of the faulted circuit will be available for triggering silicon controlled rectifier 73 or 73' through its control electrode. When one silicon controlled rectifier is triggered to conduction, the opposite one is also triggered because of the cross-connected transformers 72 and 72', as has been explained.

In any of these fault situations the amplifier remains inoperative until it has been shut off and restarted. The speed of response of the protection elements can be made extremely fast, up to the turn-on time of the silicon controlled rectifiers, which is of the order of one microsecond. This is sufficiently rapid to save any semiconductor device that has not, in itself, become fatally defective; including such a device which has experienced a surge of current from some internal difficulty, but which has not been serious enough to destroy it in one microsecond. Should a slower protective response be desired, this is accomplished by connecting a resistor in series between diode 75 and the control electrode of silicon controlled rectifier 73 and a capacitor from the same to common bus 64. The values of the resistor and the capacitor are selected to give a time constant according to the delay desired.

It will be understood that the actuating coil of a relay may be included in the circuits of transformers 72, 72' and the contacts of the relay connected to disconnect the primary power supply and to discharge the filter capacitors of the same, should these be of the known A.C. to D.C. type.

In FIG. 2 filter inductor 6, capacitor 7 and useful load Z within the space between the upper and the lower halves of the push-push stage will be noted as connected between bus 64 and ground 62 at Y. This is the output and demodulating circuit.

Transformers 54, 57, 72 and 72' may be commercially available pulse transformers, each having 5 millihenry inductance, 10 ohms D.C. coil resistance, a 1 to 1 turns ratio and a voltage-time (VT) or saturation constant of approximately volts microseconds 500.

The power transistors are preferably of the silicon type, of which the Texas Instruments, Inc. 1151 is suitable. As these transistors are used herein the power level loss is small, only about 200 watts total. The peak power is high in the transitions from maximum to minimum and vice-versa of the rectangular pulse-width modulated waveshape, perhaps three kilowatts peak per transistor. However, the transition period lasts for only about one microsecond and operation of the amplifier has revealed that this mode of operation does not affect the transistors, particularly if these are selected for satisfactory operation.

It is to be noted that the means of operating power transistors according to this invention, including the protective elements, makes possible worthwhile power output from the amplifier. It is possible to assemble an amplifier of the general type of the amplifier of this invention and to operate it at very low power levels without employing the method and apparatus of this invention. However, such operation is only of academic interest and can have no place in the world of practical apparatus, where a significant power capability must be available in return for the power capability of the transistors installed.

Certain comparisons of the power efficiency of amplifiers in the audio frequency range indicate the effectiveness of the type of amplifier according to this invention. The known Class A amplifier has a theoretical efficiency of 50% and a practical efficiency of perhaps 30%. For the known Class B amplifier these figures are 78% and perhaps 50%. For the amplifier of this invention the theoretical efficiency is essentially 100% and the practical efficiency 90%. In an initial laboratory embodiment of an amplifier of the type of this invention in which only one output transistor was employed and in which care was taken to reduce stray inductance to a minimum, a measured efficiency of 97% was obtained.

It will be understood that the stray inductance of the circuit of this type of amplifier should be reduced to a minimum, since it is this factor which prolongs the switching time from minimum to maximum amplitude and vice versa of the pulse-width modulated wave and it is only during such switching time that power losses occur in any amount. The stray inductance is reduced in practical embodiments by forming a cooling and connecting structure which is unified for all transistors of a given group, as transistors 80, 81, 82, etc. The transistors are mounted closely together. All leads are short and common leads take the form of straps rather than individual wires so that stray inductance is a minimum. A forced air blast is caused to flow over the unified cooling structure, allowing this to be as small as possible.

The objective of quick transitions from maximum to minimum and vice versa is further aided by providing a negative bias upon the bases of each of the power transistors, as 80, 81, 82, etc. This is provided by a battery or equivalent power supply working through the preamp-driver 83. The bias is approximately 5 volts and is distributed to each power transistor by conductor 93 of FIG. 2 for the transistors enumerated.

An additional aspect has been required in practical embodiments of this invention in order to prevent both phases of transistor groups, as 80, 81, 82, etc., and 80', 81', 82', etc., from being turned ON at the same time during the brief instants when the transitions from maximum to minimum and vice versa occur. If both of these groups are conductive at the same time a short circuit current is drawn from the combined D.C. source comprised of batteries 90 and 90'. The power transistors are thereby heated for no purpose and the efficiency and reliability of the amplifier suffers.

A delay in turning ON these transistors with respect to the excursions of the pulse-width modulated rectangular waveshape is required. This has been provided by inserting a resistance in the base circuit, resistor 94, of transistor 68 and resistor 94' in the base circuit of transistor 68'. These transistors operate in the inverted mode; that is, turning ON the power transistors corresponds to turning OFF transistors 68 and 68'. Transistors 68 and 68' are therefore driven into saturation. Resistors 94 and 94' each have a resistance of the order of 33,000 ohms, and provide a saturation delay of approximately six microseconds. This is sufficient for the desired delay in turning ON the power transistors.

A delay in turning OFF the transistors of the power output stage also causes the above-mentioned "shoot-through" effects. The reverse bias provision for the power transistors previously mentioned, however, takes care of this aspect.

FIG. 3 shows the circuit contained within the preamp-driver block 83 (or 83') in FIG. 2, from input conductor 62 to output conductor 93.

Conductor 62 connects to resistor 96, which has a resistance of 1,000 ohms and which connects to the base of NPN silicon transistor 97. This is an emitter-follower connected transistor, with resistor 98 connecting to the emitter of the transistor and to a negative bias bus 99, which has a negative potential of the order of 15 volts with respect to the common return circuit by virtue of series-connected batteries 100, 101 and 102, the positive terminal of which connects to bus 64 of FIG. 2.

In order to eliminate a turn OFF delay in transistor 103 of the preamplifier, a dual low impedance switch comprised of transistors 104 and 105 is provided.

Resistor 98 has a resistance of the order of 5,000 ohms and connects to the center junction of resistors 106 and 107, which have resistances of 1,000 ohms each. The opposite ends of resistors 106 and 107 connect to the bases of transistors 104 and 105, respectively. Transistor 104 is of the NPN type and the collector thereof connects to positive voltage bus 108. This bus connects to the positive terminal of battery or equivalent power supply 109, which typically has a voltage of thirty volts. Transistor 105 is of the PNP type and the collector thereof connects to the negative bias bus 99. The emitters of transistors 104 and 105 are connected to resistors 110 and 111 and these are further connected together to a common junction and thence to resistor 112. A resistance of the order of 20 ohms is typical for each of resistors 110 and 111, while that of resistor 112 may be 150 ohms.

The base of transistor 103 is also connected to negative bus 99 through resistor 114, of 5,000 ohms resistance. The collector of this NPN transistor is connected directly to the positive bus 108 and the emitter to the negative bus 99 through resistor 115, of 500 ohms resistance. This resistor particularly, along with certain others should be of the non-inductive type, in order that residual inductance be held to a minimum, the reason for which has been given. Actually, it is desirable that all resistors be of the non-inductive type.

The low impedance switch operates as follows.

When transistor 104 is ON and transistor 105 is OFF the junction point connecting to transistor 112 is connected to the potential of positive bus 108 through 20 ohms, while when transistor 104 is OFF and transistor 105 is ON the junction point is connected to the potential of negative bus 99 through 20 ohms. Thus providing transistor 103 with such a low impedance signal input prevents trailing of the waveform upon turn-OFF, as would otherwise occur. This gives a rapid rectilinear decay from maximum to minimum value of the rectangular waveform, as desired.

In practice, resistor 112 and transistor 103 are at the end of a long coaxial cable, thus removed from the dual switch. The latter is required to "drive" the coaxial cable, with its capacitance which must be discharged when transistor 103 is turned off. A low driving impedance is required to quickly discharge this capacitance. Resistor 112 "swamps" emitter-follower transistor 103 to prevent self-oscillation of the same.

Ordinary diode 116, which may be of the 10D2 type, is connected directly between the base and the emitter of transistor 103. This diode aids in turning off the following stage by providing a discharge path for stray capacitance.

The emitter of transistor 103 connects to the base of transistor 118 through resistor 119, which has a resistance of 10 ohms. Both transistors 103 and 118 are connected as emitter-follower transistors in order to provide low impedance driving energy for subsequent stages and ultimately for the multiple power transistors 80, 81, 82, etc. Accordingly, the collector of transistor 118 is connected directly to positive bus 108 and the emitter of this NPN transistor is connected to negative bus 99 through resistor 120, typically of 30 ohms resistance and of a non-inductive type. Ordinary diode 117 connects from the emitter of transistor 118 to the emitter of transistor 103 to aid in accomplishing rapid turn-OFF as before.

Driver transistor 121 provides amplified rectangular pulse-width modulated waveshape for the group of power transistors 80, 81, 82, etc. of FIG. 5 and up to a total of three such *groups* all having the same phase in a typical embodiment as the group just enumerated. The additional groups have not been shown in either of FIGS. 1 or 2, but the arrangement is easily understood as one of multiplicity of the circuitry shown. Typically, further emitter-follower transistor 122 is employed to directly drive only the one group of transistors 80, 81, 82, etc. and *additional* such transistors 122 individually drive other co-phased groups.

It will be understood that a whole other circuit according to FIG. 3 is provided for the block 83' in FIG. 2 and that the phase of driving thereof is opposite to that of the circuit of FIG. 3 that is inserted in FIG. 2 to take the place of block 83.

Continuing with FIG. 3, both transistors 118 and 121 are of the 80 watt power type in a typical embodiment and may be the Texas Instruments, Inc. type 1155, an NPN silicon transistor.

The base of transistor 121 is connected to the emitter of transistor 118 through resistor 123, which has a resistance of 5 ohms, a wattage rating of 20 watts and is of the non-inductive type. The specification of non-inductivity is to meet the requirement of minimum inductance in the circuits, as has been discussed. The emitter of transistor 121 is connected to the junction between batteries 101 and 102 through resistor 124, the potential of which junction is a negative 10 volts in a typical embodiment. Resistor 124 has all the same characteristics as did resistor 123.

The collector of transistor 121 is connected to a second positive voltage bus through diode 126 and fuse 127. Battery 128, or equivalent power supply, typically provides a potential of 80 volts, positive with respect to ground point Y. Battery 128 is thus the equivalent of battery 90 in FIG. 2. Diodes 126, 132 and other diodes in series with all output transistors perform the function of preventing current from flowing backwards through the output transistors when inductor 6 acts as a current generator. Diode 133 should be conducting, for an OFF transistor for one battery polarity is an ON transistor for the opposite battery polarity. Fuse 127 is for general protection of transistor 121. The rapid removal of drive at transistor 68, as previously described, effects initial protection for this stage as well as for the power transistor stage.

A Zener diode 129 is connected with its cathode to bus 125 and the anode is connected to the anode of ordinary diode 130, the cathode of the latter being connected to common return bus 64 of FIG. 2. Zener diode 129 is of the power type and may be of the IN3349 designation. Diode 130 may be of the 1N11345RA type. It blocks reverse conduction while diode 133 conducts. This latter diode and diode 126 may be of the 1N1345A type. Zener diode 129 clamps voltage spikes generated by distributed inductances from exceeding the breakdown voltage of transistors 121, 122, 80, 81, 82, 80′, 81′, 82′, etc., which voltage is of the order of 200 volts.

The base of individual group driver transistor 122 is connected to the emitter of transistor 121 through resistor 131, which resistor has a resistance of only two-tenths of an ohm. The collector of transistor 122 is connected to the positive voltage bus 125 through diode 132 the anode of the diode being connected to the bus. The diode may be of the A40C type. Diode 133 connects from bus 125 to return bus 64, with the cathode connected to the positive bus 125.

The emitter of transistor 122 connects to a negative potential of the order of five volts from the junction of batteries 100 and 101 through resistor 134, which resistor has a resistance of the order of 8 ohms. Conductor 93 attaches to the emitter terminal of transistor 122 and connects to the several bases of power transistors 80, 81, 82, 80′, 81′, 82′, etc. through suitable isolating resistors connected to each base, as the several resistors 136 and 136′. The resistance value of each of these resistors may be 0.2 ohm.

As to alternate embodiments, filter 6, 7 has heretofore been illustrated as having one series inductor 6, but this inductor can be split in half, with one half placed on each side of capacitor 7. With the latter embodiment for the amplifier of FIGS. 1–3, an inductance of 65 microhenries for each inductor and a capacitance of 80 microfarads is suitable. This gives a characteristic impedance of 1.3 ohms.

A further reduction of the value of these inductors for the embodiment illustrated is inadvisable, since this would allow higher triangular waveform current flow during the switching period, and this situation would require more power transistors for each group of such transistors.

In the illustrative embodiment with 80 volts direct current voltage supply the signal output is 35 volts, root mean square (RMS). For a two kilovolt-amperes rating the output current is 57 amperes RMS.

Drift compensation in the D.C. amplifiers, as 15 and 29 of FIG. 1, is preferably employed by using known feedback loop methods. This prevents changes of pulse width with changes in temperature and/or changes in D.C. voltages.

Various other modifications in the characteristics of the circuit elements, details of circuit connections and alteration of the coactive relation between the elements may be taken without departing from the scope of the invention.

Having thus fully described the invention and the manner in which it is to be practiced, we claim:

1. An electrical amplifier comprising;
(a) first means to form a pulse-wides modulated signal,
(b) second and third means connected to said first means to form two separate differentiated waveforms from said pulse-width modulated signal,
(c) a first transformer connected to said second means and a second transformer connected to said third means to provide separate isolated outputs of said differentiated waveforms having opposite phase.
(d) fourth means to reform said pulse-width modulated signal from the differentiated waveform of said second means, said fourth means connected to said first transformer,
(e) fifth means to reform said pulse-width modulated signal at opposite phase to that of said fourth means from the differentiated waveform of said third means, said fifth means connected to said second transformer,
(f) a phase-opposed amplifier connected to said fourth and said fifth means to amplify the reformed said pulse-width modulated signal, and
(g) means to demodulate the amplified said pulse-width modulated signal connected to said phase-opposed amplifier.

2. An electrical amplifier comprising;
(a) a source of signal to be amplified,
(b) a waveform generator to produce an electrical variation varying repetitively linearly as a function of time,
(c) a mixing circuit connected to said source of signal and to said generator to superimpose the variations of said generator upon the signal of said source of signal,
(d) a comparator connected to said mixing circuit to form a first rectangular waveform having excursions depending upon the length of time the superimposed variations of said generator and the signal of said source exceed a threshold,
(e) a phase isolator connected to said comparator to provide separate outputs of said rectangular waveform,
(f) a pair of differentiators each connected to a respective separate output of said phase isolator to provide first derivative pulses from each output of said first rectangular waveform,
(g) a pair of pulse transformers each connected to a respective one of said differentiators to provide separate isolated outputs of said first derivative pulses of opposite phase,
(h) a plurality of bistable circuits each connected to respective one of said pulse transformers to form second rectangular waveforms from said first derivative pulses which are related in time to said first rectangular waveform and have opposite phase,
(i) a driver circuit connected to each bistable circuit to increase the power level of said second rectangular waveforms,
(j) a push-push power amplifier circuit having a plurality of semi-conductor devices each driven by a said driver circuit according to one phase of said second rectangular waveform, and
(k) a low pass filter connected to the output of said push-push power amplifier circuit to filter out the excursions of said second rectangular waveform and to pass an amplified replica of the signal from said source of signal to be amplified.

3. The electrical amplifier of claim 2 which additionally includes:
(a) a transistor having a base and an emitter-collector circuit,
(b) means connecting said emitter-collector circuit of said transistor to pass driving current to said semiconductor device of said push-push amplifier,
(c) a resistor connected to said base of said transistor to control the saturation time of said transistor, and
(d) means coupling said resistor with said phase isolator to turn off said transistor when said semiconductor device is turned on.

4. The electrical amplifier of claim 2 in which said comparator includes a zero hysteresis threshold circuit comprising;
(a) a tunnel diode,
(b) means to bias said tunnel diode to a monostable characteristic, and
(c) means to connect said tunnel diode in said comparator to form said first rectangular waveform from said superimposed variations.

5. The electrical amplifier of claim 2 in which said bistable circuits each comprise;
(a) a tunnel diode, (b) a first resistor, (c) means to connect the respective tunnel diode across said pulse transformer in series with said first resistor, (d) a second resistor, and (e) means to impress a supply voltage upon said tunnel diode through said second resistor to bias said tunnel diode to a bistable characteristic.

6. The electrical amplifier of claim 2 in which the semiconductor devices of the push-push amplifier of paragraph (j) are;

(a) power transistors of one conductivity type designation.

7. A push-push electrical amplifier comprising;

(a) a source of signal to be amplified, (b) a waveform generator to produce an electrical variation varying repetitively linearly as a function of time, (c) a mixing circuit connected to said source of signal and to said generator to superimpose the variations of said generator upon the signal of said source of signal, (d) a comparator connected to said mixing circuit to form a rectangular waveform having excursions depending upon the length of time the superimposed variations of said generator and the signal of said source exceed a threshold, (e) phase isolator means connected to said comparator to provide oppositely phased outputs of said rectangular waveform, (f) a pair of push-push connected solid state switching amplifier means connected to said phase isolator means to switch alternately according to said oppositely phased outputs, (g) a low pass filter and a load impedance successively connected in series to said solid state switching means, and (h) a pair of primary current sources connected to said load impedance and to said pair of solid state switching means to pass current from said primary current sources through said load under the control of said pair of solid state switching means.

8. The push-push electrical amplifier of claim 7 which additionally includes;

(a) an inductor connected in shunt to one of said solid state switching amplifier means to act as a secondary current source, whereby said secondary current source alternately stores and supplies electrical energy with respect to said low pass filter to make the equivalent impedance of said low pass filter a resistive impedance.

References Cited

UNITED STATES PATENTS 2,379,513 7/1945 Fisher ------------ 330—10 X

NATHAN KAUFMAN, *Primary Examiner.*